(12) United States Patent
Zhang et al.

(10) Patent No.: US 10,665,748 B2
(45) Date of Patent: May 26, 2020

(54) LIGHT EMITTING DIODE AND FABRICATION METHOD THEROF

(71) Applicant: XIAMEN SANAN OPTOELECTRONICS TECHNOLOGY CO., LTD., Xiamen (CN)

(72) Inventors: Jie Zhang, Xiamen (CN); Xiangxu Feng, Xiamen (CN); Chengxiao Du, Xiamen (CN); Jianming Liu, Xiamen (CN); Chen-ke Hsu, Xiamen (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 72 days.

(21) Appl. No.: 15/849,566

(22) Filed: Dec. 20, 2017

(65) Prior Publication Data
US 2018/0138358 A1 May 17, 2018

Related U.S. Application Data

(63) Continuation of application No. PCT/CN2016/097803, filed on Sep. 1, 2016.

(30) Foreign Application Priority Data

Nov. 2, 2015 (CN) .......................... 2015 1 0727669

(51) Int. Cl.
*H01L 33/06* (2010.01)
*H01L 33/10* (2010.01)
(Continued)

(52) U.S. Cl.
CPC ............ *H01L 33/06* (2013.01); *H01L 33/007* (2013.01); *H01L 33/025* (2013.01); *H01L 33/10* (2013.01);
(Continued)

(58) Field of Classification Search
None
See application file for complete search history.

(56) References Cited

U.S. PATENT DOCUMENTS

| 7,303,630 B2 * | 12/2007 | Motoki | C30B 25/18 |
| | | | 117/101 |
| 2014/0332756 A1 * | 11/2014 | Kashihara | H01L 33/24 |
| | | | 257/22 |
| 2015/0249181 A1 * | 9/2015 | Leirer | H01L 33/06 |
| | | | 257/13 |

FOREIGN PATENT DOCUMENTS

| CN | 102956769 A | 3/2013 |
| CN | 103078019 A | 5/2013 |

(Continued)

*Primary Examiner* — Robert K Carpenter
(74) *Attorney, Agent, or Firm* — Syncoda LLC; Feng Ma

(57) ABSTRACT

A light-emitting diode includes from bottom to up: a substrate, a first-conductive type semiconductor layer, a super lattice, a multi-quantum well layer and a second-conductive type semiconductor layer. At least one layer of granular medium layer is inserted in the super lattice. The granular medium layer is used for forming V pits with different widths and depths in the super lattice. The multi-quantum well layer fills up the V pits and is over the top surface of the super lattice. The number of micro-particle generations, positions and densities can be adjusted by introducing granular medium layers and controlling the number of layers, position and growth conditions during super lattice growth process, to ensure V pits of different depths and densities. This can change hole injection effect, effectively improve hole injection efficiency and distribution uniformity in all quantum wells, thus improving LED light-emitting efficiency.

20 Claims, 3 Drawing Sheets

(51) Int. Cl.
*H01L 33/22* (2010.01)
*H01L 33/32* (2010.01)
*H01L 33/02* (2010.01)
*H01L 33/00* (2010.01)
H01L 33/04 (2010.01)

(52) U.S. Cl.
CPC .............. *H01L 33/22* (2013.01); *H01L 33/04* (2013.01); *H01L 33/32* (2013.01)

(56) References Cited

FOREIGN PATENT DOCUMENTS

| | | |
|---|---|---|
| CN | 103985799 A | 8/2014 |
| KR | 1020150078642 A | 7/2015 |

\* cited by examiner

LIGHT EMITTING DIODE AND FABRICATION METHOD THEROF

CROSS-REFERENCE TO RELATED APPLICATIONS

The present application is a continuation of, and claims priority to, PCT/CN2016/097803 filed on Sep. 1, 2016, which claims priority to Chinese Patent Application No. 201510727669.5 filed on Nov. 2, 2015. The disclosures of these applications are hereby incorporated by reference in their entirety.

BACKGROUND

Light Emitting Diode (LED) is a semiconductor solid light-emitting device, using semiconductor PN junction as the light-emitting material for direct photovoltaic conversion. At present, the InGaN/GaN light-emitting diode is regarded as the most potential light-emitting source. However, due to low hole concentration and hole mobility of the P-GaN material, the injection depth in the multi-quantum well (MQW) is limited, which greatly restricts further improvement of GaN-based LED light-emitting efficiency.

SUMMARY

The inventors of the present disclosure have recognized that, as verified by more theoretical research and test results, V-type defects are very important hole injection channels in the GaN-based LED, which greatly improves hole injection efficiency. The principle for V pits naturally formed in conventional structure is that: the super lattice growth layer is of low temperature, and the nitride (such as GaN) has poor lateral epitaxy. This time, V pits would be formed due to threading dislocation. However, as TEM and AFM analysis shown, initial formation positions and sizes of V pits are basically consistent. As a result, hole injection efficiency in specific multi-quantum well (QW) position is high, yet injection efficiency in other quantum wells (QWs) is low, which influences lighting efficiency.

The present disclosure is to provide a LED epitaxial structure and fabrication method thereof, wherein, a granular medium layer is inserted to form V pits of different widths and depths, which greatly improves hole injection efficiency in the LED and the space distribution of holes in MQW, thus improving hole utilization efficiency of all QWs and lighting efficiency of LED.

According to one aspect of the present disclosure, a light-emitting diode with high hole injection efficiency is provided, including from bottom to up: a substrate, a first-conductive type semiconductor layer, a super lattice, a multi-quantum well layer and a second-conductive type semiconductor layer; wherein, at least one granular medium layer is embedded in the super lattice; wherein, the granular medium layer is used for forming V pits with different widths and depths in the super lattice; and the multi-quantum well layer fills up the V pits and is over the top surface of the super lattice.

In some embodiments, form a buffer layer over the substrate, which prefers to be InAlGaN.

In some embodiments, the first-conductive type semiconductor layer includes an N-GaN layer, or includes a U-GaN layer and an N-GaN layer.

In some embodiments, the second-conductive type semiconductor layer includes a P-GaN layer, or includes an electronic blocking layer and a P-GaN layer, or includes an electronic blocking layer, a P-GaN layer and a contact layer.

In some embodiments, the grain size of the granular medium layer is 0.5-5 nm, and the V pits are 50-500 nm wide.

In some embodiments, the depth H of the V pits depends on the total thickness of the super lattice T1, the total thickness of the multi-quantum well layer T2 and the position of the granular medium layer in the super lattice layer, and satisfies T2<H<T1+T2.

In some embodiments, the density of the granular medium layer is basically corresponding to that of the V pits, which ranges from $1\times10^7$ cm$^{-2}$ to $1\times10^9$ cm$^{-2}$.

In some embodiments, the material of the granular medium layer can be $Mg_xN_y$, $Si_xN_y$, $Si_xO_y$, $Ti_xO_y$, $Zr_xO_y$, $Hf_xO_y$, $Ta_xO_y$ or any of their combinations.

According to a second aspect of the present disclosure, a fabrication method of a LED epitaxial structure is provided, including:

(1) providing a substrate;
(2) growing a first-conductive type semiconductor layer over the substrate;
(3) forming a super lattice over the first-conductive type semiconductor layer, and inserting at least one granular medium layer during growth of the super lattice, wherein, the granular medium layer is used for forming V pits with different widths and depths in the super lattice;
(4) growing a multi-quantum well layer over the V pits and the top surface of the super lattice;
(5) growing a second-conductive type semiconductor layer over the multi-quantum well layer.

In some embodiments, grow a buffer layer over the substrate, and the material prefers to be InAlGaN.

In some embodiments, the first-conductive type semiconductor layer includes an N-GaN layer, or includes a U-GaN layer and an N-GaN layer.

In some embodiments, the second-conductive type semiconductor layer includes a P-GaN layer, or includes an electronic blocking layer and a P-GaN layer, or includes an electronic blocking layer, a P-GaN layer and a contact layer.

In some embodiments, the grain size of the granular medium layer is 0.5-5 nm, and the V pits are 50-500 nm wide.

In some embodiments, the depth H of the V pits depends on the total thickness of the super lattice T1, the total thickness of the multi-quantum well layer T2 and the position of the granular medium layer in the super lattice layer, and satisfies T2<H<T1+T2.

In some embodiments, density of the granular medium layer is basically corresponding to the V pits density, and density range of the V pits is $1\times10^7$ cm$^{-2}$ to $1\times10^9$ cm$^{-2}$.

In some embodiments, the material of the granular medium layer can be $Mg_xN_y$, $Si_xN_y$, $Si_xO_y$, $Ti_xO_y$, $Zr_xO_y$, $Hf_xO_y$, $Ta_xO_y$ or any of their combinations.

In some embodiments, growing temperature for the super lattice is 700-900° C.

In some embodiments, in step (3), at least one granular medium layer is inserted during super lattice growth, wherein, the super lattice is easy to form V pits over the granular medium layer from the epitaxial surface due to low growth temperature and poor lateral epitaxial capacity.

According to a third aspect of the present disclosure, a light-emitting system comprising a plurality of light-emitting diodes is provided. Each light-emitting diode further includes from bottom to up: a substrate, a first-conductive type semiconductor layer, a super lattice, a multi-quantum well layer and a second-conductive type semiconductor layer; wherein, at least one granular medium layer is embedded in the super lattice; wherein, the granular medium layer is used for forming V pits with different widths and depths in the super lattice; and the multi-quantum well layer fills up the V pits and is over the top surface of the super lattice. The light-emitting system can be used in the field of, for example, lighting, display, signage, etc.

Compared with existing technologies, various embodiments of the present disclosure can have one or more of the technical effects: number of micro-particle generations, positions and densities can be adjusted by introducing granular medium layers and controlling the number of layers, position and growth conditions during super lattice growth process, to ensure match of V pits of different depths and densities. This can change hole injection effect, effectively improve hole injection efficiency and distribution uniformity in all quantum wells (QWs), thus improving LED light-emitting efficiency.

BRIEF DESCRIPTION OF THE DRAWINGS

The accompanying drawings, which are included to provide a further understanding of the disclosure and constitute a part of this specification, together with the embodiments, are therefore to be considered in all respects as illustrative and not restrictive. In addition, the drawings are merely illustrative, which are not drawn to scale.

In the drawings: 1: substrate; 2: buffer layer; 3: U-GaN layer; 4: N-GaN layer; 5: super lattice; 6 (6A, 6B, 6C): granular medium layer; 7: multi-quantum well layer; 8: electronic blocking layer; 9: P-GaN layer; 10: contact layer.

DETAILED DESCRIPTION

The present disclosure will be explained in details with reference to the accompanying drawings. Before further description, it should be understood, however, that various modifications and changes may be made to these embodiments. Therefore, the present disclosure is not limited to the embodiments below. It should also be noted that the scope of the present disclosure should still be subjected to the scope defined in the claims and the embodiments are merely for purposes of illustration, rather than restricting. Unless otherwise specified, all technical and scientific words shall have the same meanings as understood by persons skilled in the art.

Embodiment 1

Figure 1:
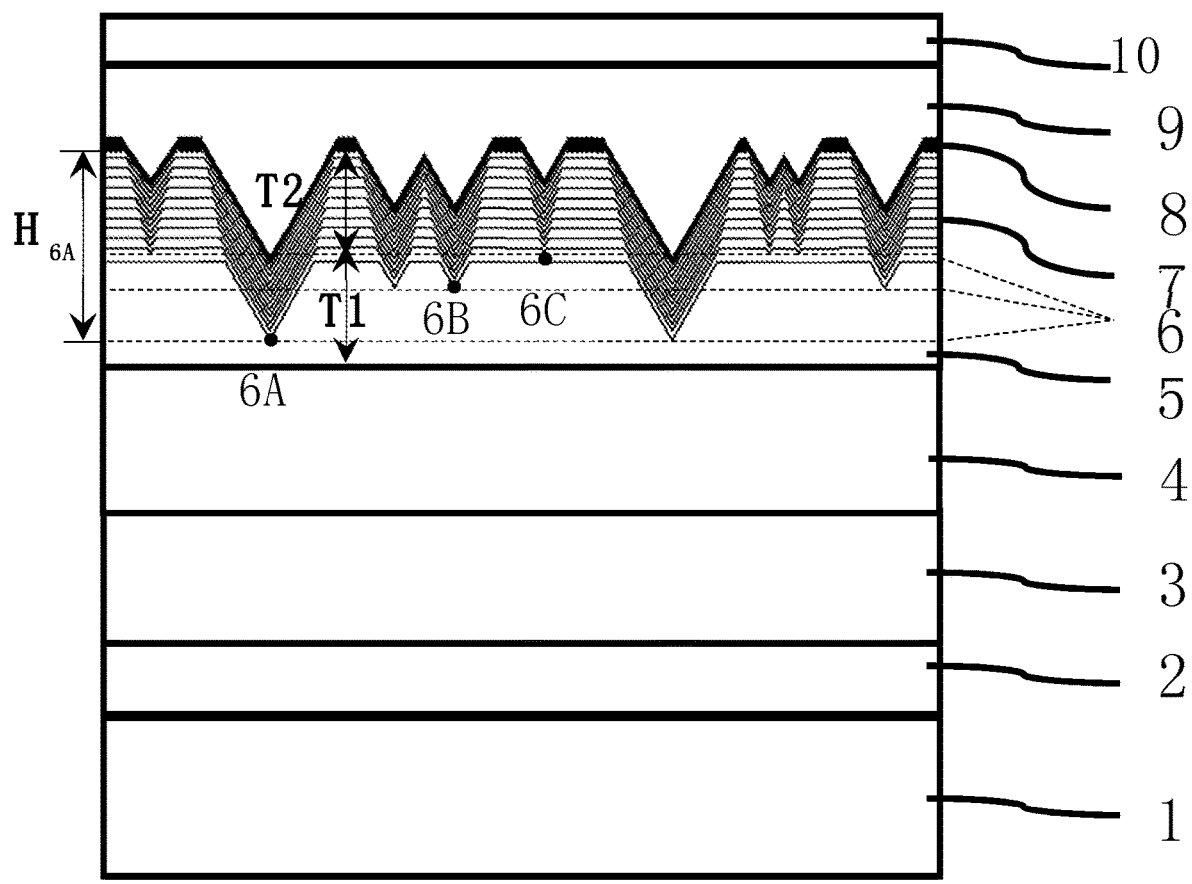
FIG. 1 illustrates a sectional view of the LED epitaxial structure according to some embodiments in the present disclosure.
Figure 2:
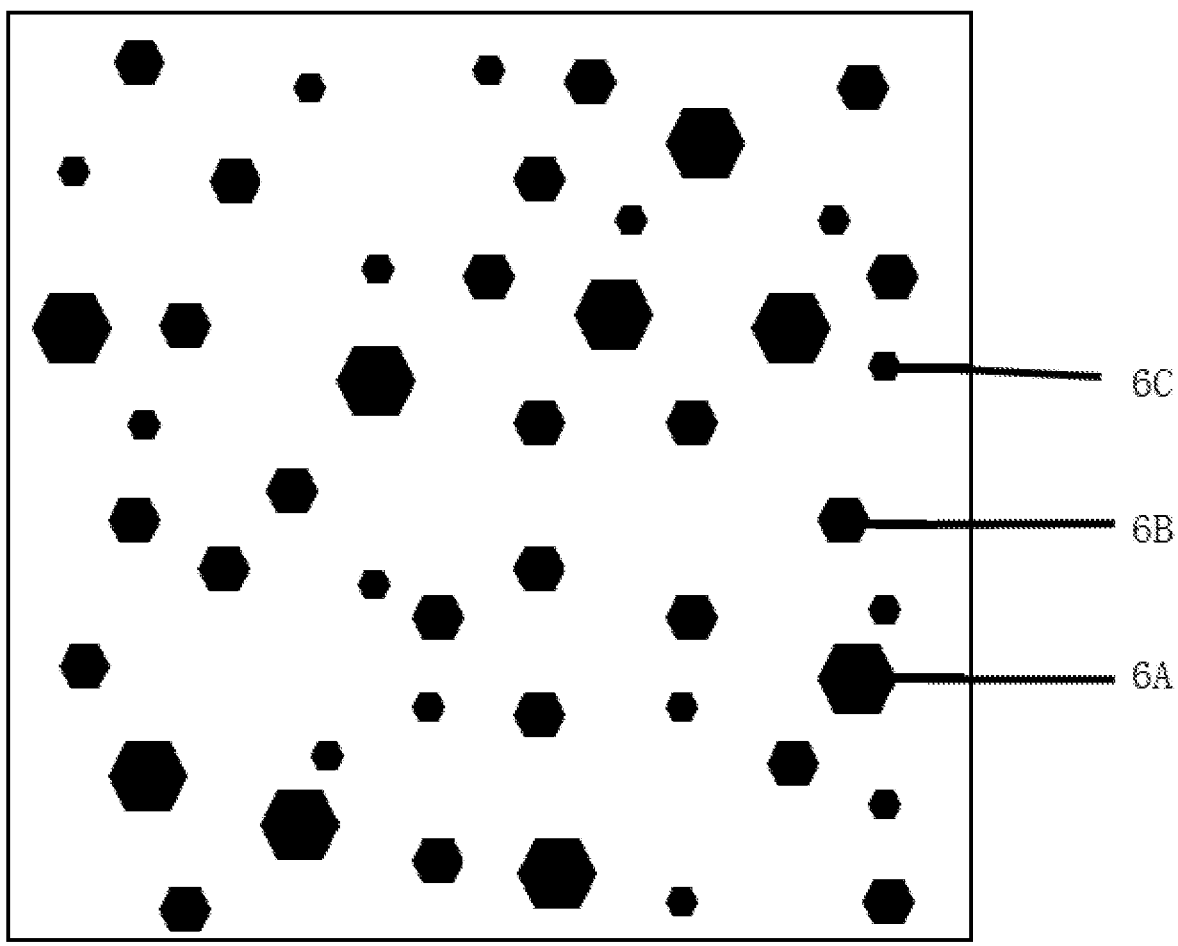
FIG. 2 illustrates a top view of the LED epitaxial structure according to some embodiments of the present disclosure.

With reference to FIGS. 1 and 2, an LED epitaxial structure is provided, which includes from bottom to up: a substrate 1, a buffer layer 2, a first-conductive type semiconductor layer including a U-GaN layer 3 and an N-GaN layer 4, a super lattice 5, a multi-quantum well layer 7 and a second-conductive type semiconductor layer comprising an electronic blocking layer 8, a P-GaN layer 9 and a contact layer 10; wherein, at least one granular medium layer 6 is inserted in the super lattice. The granular medium layer 6 is used for forming V pits of different widths and depths in the super lattice, and the multi-quantum well layer 7 fills up the V pits and is over the super lattice.

Specifically, the substrate 1 in this embodiment is selected from at least one of sapphire ($Al_2O_3$), SiC, GaAs, GaN, ZnO, Si, GaP, InP and Ge. In some embodiments, a plain sapphire substrate is preferred, which is not illustrated. The sapphire substrate can also be a patterned sapphire substrate (PSS), but the embodiments are not limited thereto.

The buffer layer 2 is formed over the substrate 1 with InAlGaN semiconductor material, which eliminates the lattice mismatch caused by lattice constant difference between the substrate 1 and the first-conductive type semiconductor layer, thus improving epitaxial growth quality.

The U-GaN layer 3 and the N-GaN layer 4 form a first-conductive type semiconductor layer, which are grown over the buffer layer 2 in successive. The U-GaN layer 3 can eliminate the lattice mismatch caused by lattice constant difference between the substrate 1 and the N-GaN layer 4. In addition, the U-GaN layer 3 can improve the crystallization property of the semiconductor layer formed over this layer.

The super lattice 5 is formed over the first-conductive type semiconductor layer, which is repeatedly and alternatively stacked by InGaN layers and GaN layers for about 15-25 times. Insert three granular medium layers 6 (6A, 6B and 6C) in the super lattice 5, which are used for forming V pits in the super lattice. The material of the granular medium layers is $Mg_xN_y$, $Si_xN_y$, $Si_xO_y$, $Ti_xO_y$, $Zr_xO_y$, $Hf_xO_y$, $Ta_xO_y$ or any of their combinations. In this embodiment, $Si_xN_y$ is preferred with grain size of 0.5-5 nm. The depth H (such as $H_{6A}$) of the V pits depends on the total thickness of the super lattice T1, the total thickness of the multi-quantum well layer T2 and the position of the granular medium layer in the super lattice layer, and satisfies T2<H<T1+T2. The density of the SiN granular medium layer is basically corresponding to that of the V pits, which ranges from $1\times10^7$ $cm^{-2}$ to $1\times10^9$ $cm^{-2}$.

A multi-quantum well layer 7 fills up the V pits and is over the top surface of the super lattice 5. The multi-quantum well layer can be $In_xAl_yGa_{1-x-y}N$ ($0\leq x\leq 1$, $0\leq y\leq 1$, $0\leq x+y\leq 1$) semiconductor material, which is alternatively stacked by a plurality of well layers and barrier layers, in some embodiments, for 4-20 times.

An electronic blocking layer 8, a P-GaN layer 9 and a contact layer 10 form a second-conductive type semiconductor layer, which are formed over the multi-quantum well layer 7 in successive.

Figure 3:
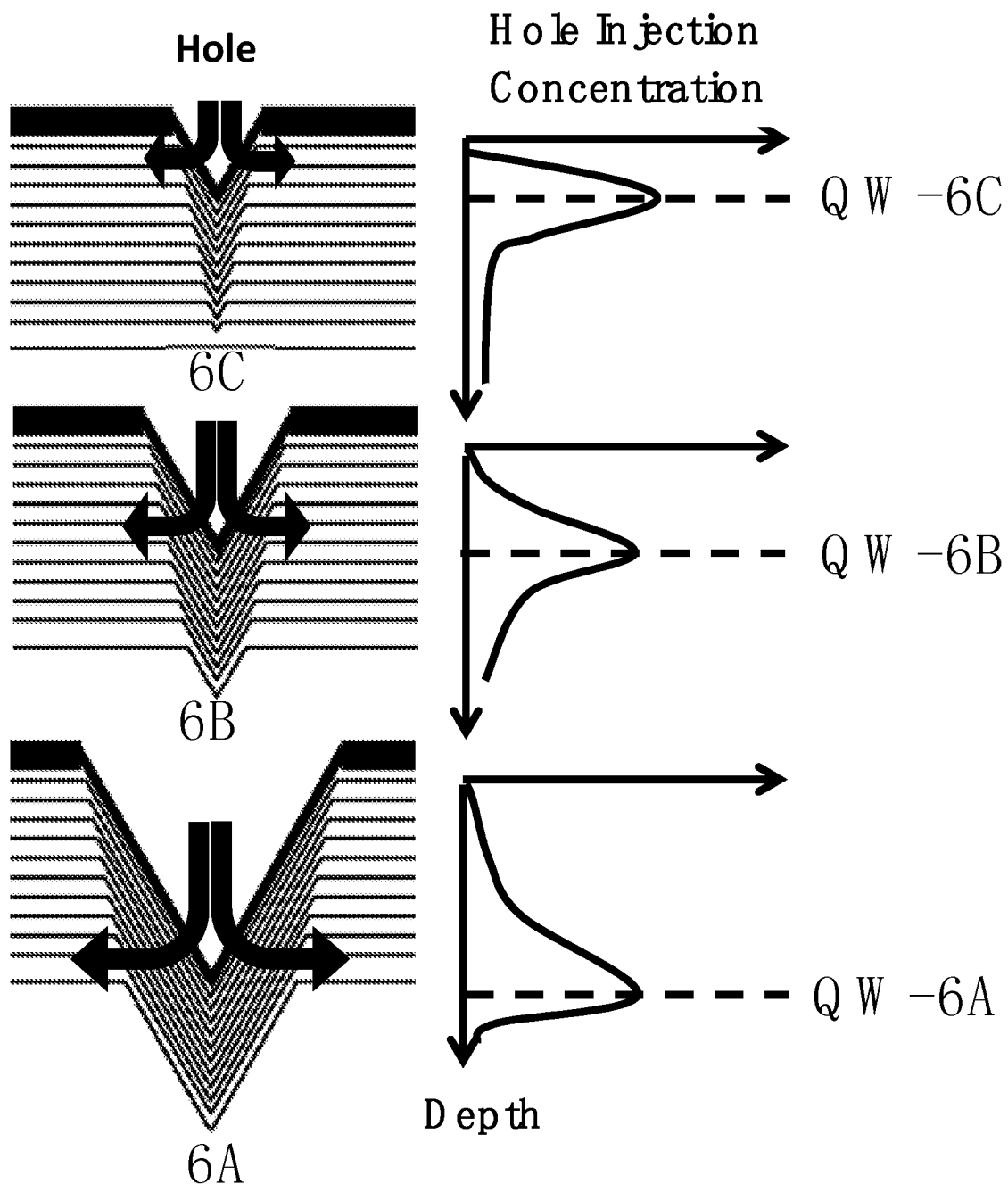
FIG. 3 shows a schematic diagram of hole injection positions in MQW of V pits at different depths.

Referring to FIG. 3, QW-6A, QW-6B and QW-6C represent hole injection concentration of V pits of three different depths in main positions of the MQW. 6A is the deepest layer of V pits, wherein, when holes are injected to the MQW through this layer of V pits, hole injection is distributed at the bottom QW. 6B is the middle layer of V pits, wherein, when holes are injected to the MQW through this layer of V pits, hole injection is mainly distributed in the middle QW. 6C is the shallowest layer of V pits, wherein, when holes are injected to the MQW through this layer of V pits, hole injection is mainly distributed over the uppermost QW. In the present disclosure, space distribution of holes in MQW and hole injection concentration of the LED can be improved by controlling sizes, depths and densities of V pits of layers 6A, 6B and 6C, thus improving hole injection efficiency of all QWs and lighting efficiency of LED.

Embodiment 2

Referring to FIGS. 1-2, a fabrication method of a LED epitaxial structure is provided, which includes:

(1) providing a substrate 1, which can be at least one of sapphire (Al$_2$O$_3$), SiC, GaAs, GaN, ZnO, Si, GaP, InP and Ge. In some embodiments, a patterned sapphire substrate (PSS) is preferred.

(2) forming a buffer layer 2 over the substrate 1. In some embodiments, InAlGaN semiconductor material is preferred. The epitaxial growth method can be MOCVD (metal-organic chemical vapor deposition), CVD (chemical vapor deposition), PECVD (plasma enhanced vapor deposition), MBE (molecular beam epitaxy) and HVPE (hydride vapor phase epitaxy). It is preferred to be MOCVD, but the embodiments are not limited thereto.

(3) growing a U-GaN layer 3 and an N-GaN layer 4 in successive over the buffer layer 2 to form a first-conductive type semiconductor layer.

(4) growing a super lattice 5 via epitaxial growth over the first-conductive type semiconductor layer under 700-900° C., which is repeatedly and alternatively stacked by InGaN layers and GaN layers for about 15-25 times. Insert 3 layers of silicon nitride (Si$_x$N$_y$) granular medium layers 6 (6A, 6B and 6C) in the super lattice 5. It is easy to form V pits over the granular medium layer from the epitaxial surface due to the low growth temperature and poor lateral epitaxial capacity of the super lattice. In this embodiment, the grain size of the granular medium layer prefers to be 0.5-5 nm, and the width of V pits ranges from 50 nm to 500 nm. The depth H of the V pits depends on the total thickness of the super lattice T1, the total thickness of the multi-quantum well layer T2 and the position of the granular medium layer in the super lattice layer, and satisfies T2<H<T1+T2. The density of the granular medium layer is basically corresponding to that of the V pits, which ranges from $1\times10^7$ cm$^{-2}$ to $1\times10^9$ cm$^{-2}$. The growth sequence of 3 granular medium layers is: 6A, 6B and 6C. The size, depth and density of the V pits are to be optimized based on chip design and working current. Based on theoretical calculation and reference to experimental results, in this embodiment, preferably, V pits depth relationship is: 6A>6B>6C; and position depth in the super lattice relationship is: 6A>6B>6C; and density relationship is: 6B>6C>6A.

(5) forming a multi-quantum well layer 7 over the V pits and the top surface of the super lattice 5 via epitaxial growth. The multi-quantum well layer is In$_x$Al$_y$Ga$_{1-x-y}$N (0≤x≤1, 0≤y≤1, 0≤x+y≤1), and is alternatively stacked by a plurality of well layers and barrier layers, preferably, for 4-20 times.

(6) forming an electronic blocking layer 8, a P-GaN layer 9 and a contact layer 10 over the multi-quantum well layer 7 via epitaxial growth to form a second-conductive type semiconductor layer.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light-emitting diode, comprising:
    a first-conductive type semiconductor layer;
    a super lattice;
    a multi-quantum well layer;
    a second-conductive type semiconductor layer;
    wherein, at least one medium layer having a plurality of grains therein is embedded in the super lattice;
    the medium layer is used for forming V pits with different widths and depths in the super lattice;
    the multi-quantum well layer fills up the V pits and is over a top surface of the super lattice; and
    a density of the plurality of grains in the medium layer is approximately same as that of the V pits.

2. The light-emitting diode of claim 1, wherein, sizes of the plurality of grains in the medium layer are 0.5-5 nm, and the V pits are 50-500 nm wide.

3. The light-emitting diode of claim 1, wherein, the depth H of the V pits depends on a total thickness of the super lattice T1, a total thickness of the multi-quantum well layer T2 and a position of the medium layer in the super lattice layer, and satisfies T2<H<T1+T2.

4. The light-emitting diode of claim 1, wherein, the density of the plurality of grains in the medium layer ranges from $1\times10^7$ cm$^{-2}$ to $1\times10^9$ cm$^{-2}$.

5. The light-emitting diode of claim 1, wherein, the medium layer comprises at least one of Mg$_x$N$_y$, Si$_x$N$_y$, Si$_x$O$_y$, Ti$_x$O$_y$, Zr$_x$O$_y$, Hf$_x$O$_y$, or Ta$_x$O$_y$.

6. The light-emitting diode of claim 1, wherein, three granular medium layers are inserted during growth of the super lattice.

7. A method of fabricating the light-emitting diode according to claim 1, the method comprising:
    (1) providing a substrate;
    (2) growing a first-conductive type semiconductor layer over the substrate;
    (3) forming a super lattice over the first-conductive type semiconductor layer, and inserting at least one medium layer having a plurality of grains therein during growth of the super lattice, wherein, the medium layer is used for forming V pits with different widths and depths in the super lattice;
    (4) growing a multi-quantum well layer over the V pits and a top surface of the super lattice;
    (5) growing a second-conductive type semiconductor layer over the multi-quantum well layer.

8. The fabrication method of claim 7, wherein: sizes of the plurality of grains in the medium layer are 0.5-5 nm, and the V pits are 50-500 nm wide.

9. The fabrication method of claim 7, wherein, the depth H of the V pits depends on a total thickness of the super lattice T1, a total thickness of the multi-quantum well layer T2 and a position of the granular medium layer in the super lattice layer, and satisfies T2<H<T1+T2.

10. The fabrication method of claim 7, wherein, the density of the plurality of grains in the medium layer ranges from $1\times10^7$ cm$^{-2}$ to $1\times10^9$ cm$^{-2}$.

11. The fabrication method of claim 7, wherein, the medium layer comprises at least one of Mg$_x$N$_y$, Si$_x$N$_y$, Si$_x$O$_y$, Ti$_x$O$_y$, Zr$_x$O$_y$, Hf$_x$O$_y$, or Ta$_x$O$_y$.

12. The fabrication method of claim 7, wherein, a growth temperature for the super lattice is 700-900° C.

13. The fabrication method of claim 7, wherein, in step (3), at least one medium layer is inserted during growth of the super lattice; thereby facilitating the super lattice to form the V pits at the medium layer from an epitaxial surface due to low growth temperature and poor lateral epitaxial capacity.

14. A light-emitting system comprising a plurality of light-emitting diodes, wherein each light-emitting diode comprises:
a first-conductive type semiconductor layer;
a super lattice;
a multi-quantum well layer;
a second-conductive type semiconductor layer;
wherein, at least one medium layer having a plurality of grains therein is embedded in the super lattice;
the medium layer is used for forming V pits with different widths and depths in the super lattice;
the multi-quantum well layer fills up the V pits and is over a top surface of the super lattice; and
a density of the plurality of grains in the medium layer is approximately same as that of the V pits.

15. The light-emitting system of claim 14, wherein, sizes of the plurality of grains in the medium layer are 0.5-5 nm, and the V pits are 50-500 nm wide.

16. The light-emitting system of claim 14, wherein, the depth H of the V pits depends on a total thickness of the super lattice T1, a total thickness of the multi-quantum well layer T2 and a position of the granular medium layer in the super lattice layer, and satisfies T2<H<T1+T2.

17. The light-emitting system of claim 14, wherein, the density of the plurality of grains in the medium layer ranges from $1\times10^7 cm^{-2}$ to $1\times10^9 cm^{-2}$.

18. The light-emitting system of claim 14, wherein, the medium layer comprises at least one of $Mg_xN_y$, $Si_xN_y$, $Si_xO_y$, $Ti_xO_y$, $Zr_xO_y$, $Hf_xO_y$, or $Ta_xO_y$.

19. The light-emitting system of claim 14, wherein, three medium layers are inserted during growth of the super lattice.

20. The light-emitting system of claim 14, wherein, a growth temperature for the super lattice is 700-900° C.

* * * * *